United States Patent

Miyamoto et al.

[11] Patent Number: 5,609,988
[45] Date of Patent: Mar. 11, 1997

[54] RADIATION SENSITIVE RESIN COMPOSITION

[75] Inventors: Hidetoshi Miyamoto; Shinji Shiraki; Yoshiji Yumoto; Takao Miura, all of Yokkaichi, Japan

[73] Assignee: Japan Synthetic Rubber Co., Ltd., Tokyo, Japan

[21] Appl. No.: 229,746

[22] Filed: Apr. 19, 1994

[30] Foreign Application Priority Data

Apr. 19, 1993 [JP] Japan ................... 5-114202

[51] Int. Cl.$^6$ .................. G03C 1/492
[52] U.S. Cl. .................. 430/270.1
[58] Field of Search ............... 430/270, 271.1

[56] References Cited

U.S. PATENT DOCUMENTS

| | | | |
|---|---|---|---|
| 3,779,778 | 12/1973 | Smith et al. | 430/270 |
| 3,954,475 | 5/1976 | Bonham et al. | 96/67 |
| 3,987,037 | 10/1976 | Bonham et al. | 260/240 D |
| 4,189,323 | 2/1980 | Buhr et al. | 430/281 |
| 5,057,397 | 10/1991 | Miyabe et al. | 430/270 |
| 5,258,257 | 11/1993 | Sinta et al. | 430/192 |
| 5,304,456 | 4/1994 | Ueda et al. | 430/270 |

FOREIGN PATENT DOCUMENTS

| | | |
|---|---|---|
| 0458325 | 11/1991 | European Pat. Off. . |
| 0483693 | 5/1992 | European Pat. Off. . |
| 0519298 | 12/1992 | European Pat. Off. . |
| 2217855 | 8/1990 | Japan . |
| 4136859 | 5/1992 | Japan . |
| 5313370 | 11/1993 | Japan . |
| WO88/02878 | 4/1988 | WIPO . |

*Primary Examiner*—Mark Chapman
*Attorney, Agent, or Firm*—Oblon, Spivak, McClelland, Maier & Neustadt, P.C.

[57] ABSTRACT

A radiation sensitive resin composition useful as a negative type resist which can form a resist pattern having a good shape, has so high acid resistance as not to be affected by an etchant and a high adhesion to the substrate, and is endowed with so high a strippability as to be easily dissolved in a stripping solution consisting of an organoalkali. Said composition comprises (1) 100 parts by weight of an alkali-soluble novolak resin having a polystyrene reduced weight average molecular weight of 1,000 to 10,000, (2) 1 to 10 parts by weight of a compound having a methylol group and/or an alkoxymethyl group and being capable of crosslinking the alkali-soluble novolak resin (1) in the presence of an acid, and (3) 0.01 to 5 parts by weight of a radiation sensitive acid-generating agent represented by formula (I):

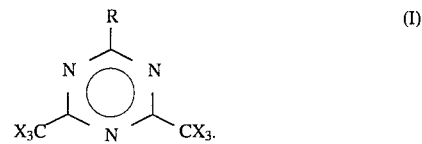

4 Claims, No Drawings

RADIATION SENSITIVE RESIN COMPOSITION

BACKGROUND OF THE INVENTION

This invention relates to a radiation sensitive resin composition useful as a negative type resist for producing a liquid crystal display device.

As a resist to be used in the lithographic process for producing a liquid crystal display element, there have heretofore been broadly adopted a positive type resist using a novolak resin and a quinonediazide compound and a negative type resist using a cyclized rubber and a bisazide radiation sensitive compound.

However, in the case of producing, for example, a liquid crystal display element, the proportion of the area of the wiring portion to the whole area of a substrate is small (namely, the portion remaining as a resist pattern is small), so that the positive type resist is disadvantageous in being liable to undergo the influence of dust. Therefore, the negative type resist is more advantageous. However, a conventional negative type resist using a cyclized rubber and a bisazide radiation sensitive compound requires an organic solvent as a developer, and hence, has such a problem that the working atmosphere is deteriorated. Thus, a difficulty has accompanied the application thereof to the production of a liquid crystal display element or the like on a commercial scale. Thus, a growing interest has recently been taken in a negative type resist developable with an alkali developer.

Also, in the lithographic process for producing a liquid crystal display element or the like, the surface of a substrate on which a resist pattern has been formed is treated by a chemical etching, an electrolytic etching or the like and then the resist pattern is dissolved in a stripping solution consisting of an organoalkali. Even in the case of a negative type resist, however, there has been strongly desired the development of a resist which can form a pattern having a good shape, has a high adhesion to the substrate and so high acid resistance as not to be affected by an etchant, and is endowed with so high a strippability as to be easily dissolved in a stripping solution.

SUMMARY OF THE INVENTION

An object of this invention is to provide a novel radiation sensitive resin composition.

A further object of this invention is to provide a radiation sensitive resin composition useful as a negative type resist which can form a resist pattern having a good shape, has so high acid resistance as not to be affected by an etchant and a high adhesion to the substrate, and is endowed with so high a strippability as to be easily dissolved in a stripping solution consisting of an organoalkali.

Other objects and advantages of this invention will become apparent from the following description.

According to this invention, there is provided a radiation sensitive resin composition, which comprises:

(1) 100 parts by weight of an alkali-soluble novolak resin having a polystyrene-reduced weight average molecular weight (referred to hereinafter as Mw) of 1,000 to 10,000 (referred to hereinafter as the specific novolak resin), (2) 1–10 parts by weight of a compound having a methylol group and/or alkoxymethyl group and being capable of cross-linking the specific novolak resin in the presence of an acid (referred to hereinafter as the cross-linking agent), and (3) 0.01–5 parts by weight of a radiation sensitive acid-generating agent represented by formula (I) (referred to hereinafter as the specific acid-generating agent):

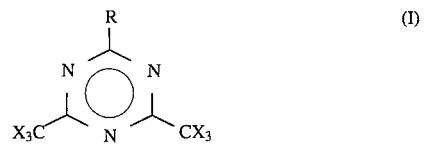

wherein R represents a —$CX_3$ group, a substituted or unsubstituted phenyl group, a substituted or unsubstituted naphthyl group, a substituted or unsubstituted styryl group, a substituted or unsubstituted furylethylidene group or a substituted or unsubstituted benzodioxolyl group, and X's may be the same as or different from one another and each represents a halogen atom.

DETAILED DESCRIPTION OF THE INVENTION (1) The specific novolak resin

The specific novolak resin used in this invention is obtained by polycondensing a phenol (referred to hereinafter as the phenol (a)) with an aldehyde in the presence of an acidic catalyst, and has a Mw of 1,000 to 10,000, preferably 2,500 to 6,000. When the Mw of the specific novolak resin exceeds 10,000, the solubility of the resin in a stripping solution consisting of an organoalkali (the solubility is referred to hereinafter as the strippability) becomes insufficient and when the Mw is less than 1,000, the sensitivity becomes low and the formation of a resist pattern becomes difficult and the acid resistance becomes insufficient.

The phenol (a) used for producing the specific novolak resin includes, for example, o-cresol, m-cresol, p-cresol, 2,3-xylenol, 2,5-xylenol, 3,5-xylenol, 2,3,5-trimethylphenol and the like.

These phenols (a) may be used alone or in admixture of two or more.

The aldehyde includes, for example, formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural and the like.

When formaldehyde is used as the aldehyde, the source for generating formaldehyde includes, for example, formalin, trioxane and paraformaldehyde and further includes hemiformals such as methylhemiformal, ethylhemiformal, propylhemiformal, butylhemiformal, phenylhemiformal and the like. Among them, formalin and butylhemiformal are particularly preferable.

The above aldehydes may be used alone or in combination of two or more. The amount of the aldehyde used is preferably 0.7 to 3 moles, more preferably 0.8 to 1.5 moles, per mole of the phenol (a).

Moreover, the above-mentioned acidic catalyst includes, for example, hydrochloric acid, nitric acid, sulfuric acid, formic acid, oxalic acid, acetic acid and the like. The amount of the acidic catalyst used is preferably $1 \times 10^{-5}$ to $5 \times 10^{-2}$ mole per mole of the phenol (a).

In the polycondensation for producing the specific novolak resin, water is usually used as a reaction medium;

however, when the phenol (a) used is not dissolved in an aqueous solution of the aldehyde to form a heterogenous phase from the beginning of the reaction, a hydrophilic solvent may be used as the reaction medium. This hydrophilic solvent includes, for example, alcohols such as methanol, ethanol, propanol, butanol and the like; acyclic ethers such as diethylene glycol dimethyl ether, 1,2-dimethoxyethane, 1,2-diethoxyethane and the like; and cyclic ethers such as tetrahydrofuran, dioxane and the like. The amount of the reaction medium used is preferably 20 to 1,000 parts by weight per 100 parts by weight of the reactants.

The polycondensation temperature may be appropriately varied depending upon the reactivity of the reactants, and is preferably 10° to 200° C.

The polycondensation method for producing the specific novolak resin may be, for example, a method in which the phenol (a), the aldehyde and the acidic catalyst may be added at one time to undergo polycondensation, a method in which the phenol (a) and the aldehyde are gradually added in the presence of the acidic catalyst to effect the polycondensation; or other methods.

After completion of the above polycondensation, in order to remove the unreacted reactants, the acidic catalyst, the reaction medium and the like present in the reaction system, the temperature of the reaction system is usually elevated to 130° to 230° C. and the volatile matters are removed under reduce pressure, for example, at a pressure of about 20 to 50 mmHg, and the specific novolak resin produced is recovered.

In this invention, the specific novolak resins may be used alone or in admixture of two or more.

Other novolak resins

In this invention, at least one alkali-soluble novolak resin having a Mw outside the range of 1,000 to 10,000 (referred to hereinafter as the other novolak resin) may be mixed with the specific novolak resin as far as the Mw of the resulting novolak resin mixture has a Mw of 1,000 to 10,000.

The other novolak resin can be obtained by subjecting the same phenols and aldehydes as the phenols (a) and aldehydes mentioned as to the specific novolak resin to polycondensation in the presence of an acidic catalyst.

Phenolic compound

Moreover, in this invention, other phenolic compounds than the specific novolak resin and the other novolak resin may be used in combination with the specific novolak resin, to thereby increase the solubility of the unirradiated portions of the composition in the developer when the composition is developed.

The above phenolic compound includes, for example, hydroxystyrene polymers, phenols having 2 to 6 benzene rings (referred to hereinafter as the phenols (b)) and the like.

These phenolic compounds may be used alone or in admixture of two or more.

The above hydroxystyrene polymer is a polymer composed of at least one member selected from the group consisting of monohydroxystyrenes such as o-hydroxystyrene, m-hydroxystyrene, p-hydroxystyrene and the like and polyhydroxystyrenes (the monohydroxystyrenes and the polyhydroxystyrenes are referred to hereinafter collectively as the hydroxystyrenes).

The hydroxystyrene polymers can be produced by a method by which the hydroxystyrenes are directly polymerized by radical polymerization, cationic polymerization, anionic polymerization, thermal polymerization or the like; a method in which the hydroxyl groups of the hydroxystyrenes are protected with a t-butyl group, an acetyl group, a t-butoxycarbonyl group, a trialkylsilyl group or the like, the thus protected hydroxystyrenes are polymerized, and the resulting polymer is hydrolyzed to remove the protecting group, or other methods.

The Mw of the hydroxystyrene polymer is preferably 200 to 8,000, more preferably 1,000 to 6,000. When the Mw is less than 200, the sensitivity of the composition tends to become low and when it exceeds 8,000 the strippability of the composition tends to be lowered.

The phenols (b) are compounds having phenolic hydroxyl groups bonded to a carbocyclic or heterocyclic, fused or unfused aromatic ring.

Specific examples of preferable phenols (b) include compounds represented by the following formulas (II) to (XI):

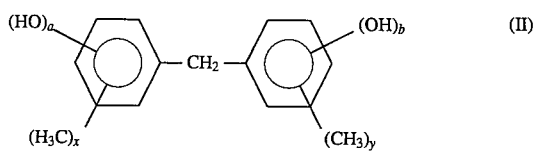

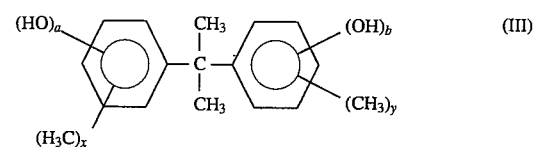

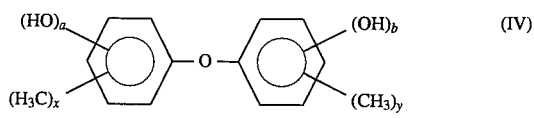

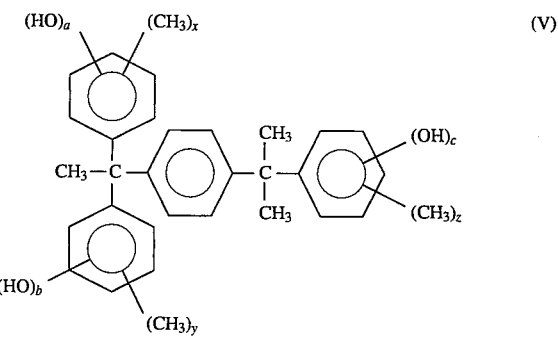

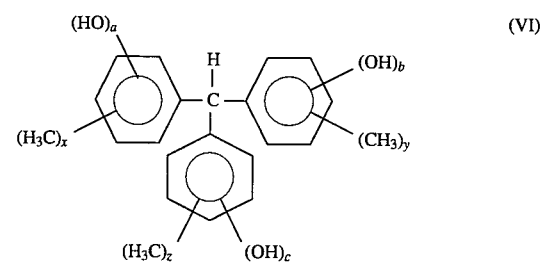

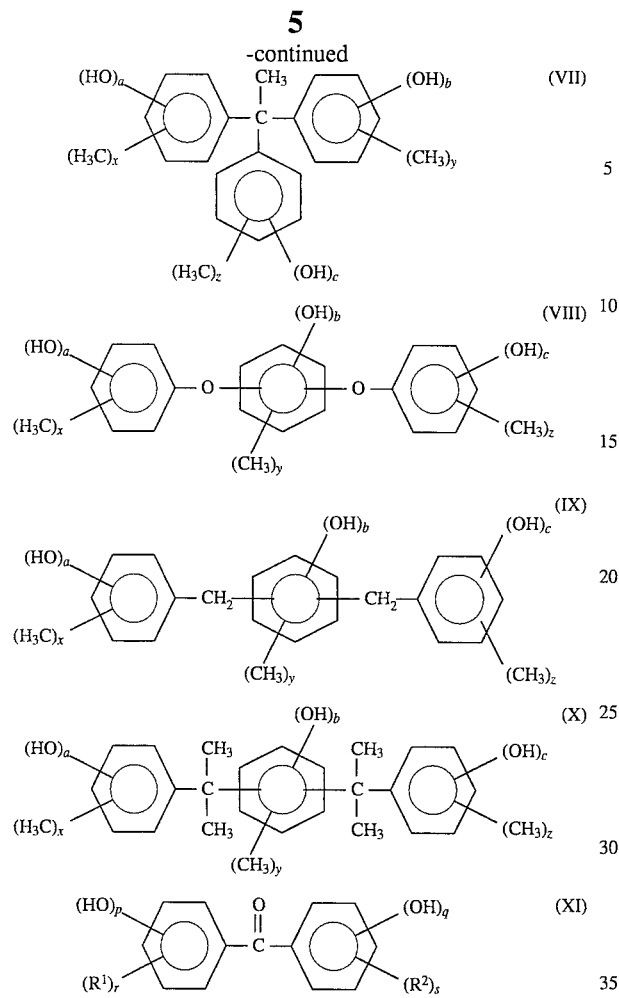

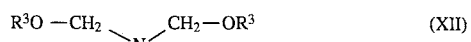

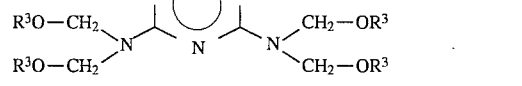

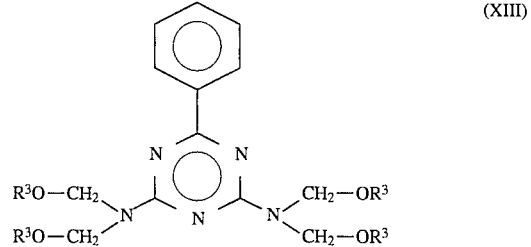

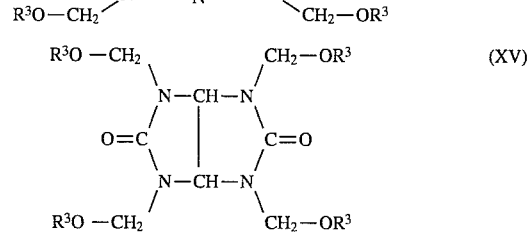

wherein each of a, b and c represents an integer of 0 to 3 (provided that the case where all of a, b and c are 0 is excluded); each of x, y and z is an integer of 0 to 3 (provided that each of (a+x), (b+y) and (c+z) does not exceed 4); and $R^1$ and $R^2$ may be the same as or different from each other and each represents a hydrogen atom, an alkyl group having 1 to 3 carbon atoms or an alkoxy group having 1 to 3 carbon atoms; each of p, q, r and s represents an integer of 0 to 5; p+q=2–6; r+s=0–5; and each of (p+r) and (q+s) does not exceed 5.

The Mw of the phenol (b) is preferably 200 to 2,000, more preferably 200 to 1,000.

In this invention, the amount of the phenolic compound used is preferably 70 parts by weight or less, more preferably 50 parts by weight or less, per 100 parts by weight of the specific novolak resin. When the amount of the phenolic compound used exceeds 70 parts by weight, the sensitivity of the composition during the development is lowered or the composition is swollen during the development, whereby it becomes difficult to form a good resist pattern and also there is a fear that the acid resistance of the composition may be lowered.

(2) Cross-linking agent

The cross-linking agent used in this invention is a compound having a methylol group and/or alkoxymethyl group and being capable of cross-linking the specific novolak resin upon heating in the presence of an acid. When this cross-linking agent has at least two alkoxymethyl groups, they may be the same as or different from one another.

Such a cross-linking agent includes, for example, a urea-formaldehyde resin, a thiourea-formaldehyde resin, a melamine-formaldehyde resin, a guanamine-formaldehyde resin, a benzoguanamine-formaldehyde resin, a glycoluril-formaldehyde resin and the like.

Among these cross-linking agents, particularly preferable are compounds represented by the following formulas (XII) to (XV) and oligomers derived from these compounds and having a Mw of 1,500 or less:

wherein $R^3$'s may be the same as or different from one another and each represents a hydrogen atom or an alkyl group having 1 to 6 carbon atoms.

The compounds represented by formulas (XII) to (XV) are commercially available as, for example, CYMEL (a trade name of Mitsui Cyanamid Co., Ltd.) and Nikalac (a trade name of Sanwa Chemical Co., Ltd.).

These cross-linking agents may be used alone or in admixture of two or more.

The amount of the cross-linking agent used is to 10 parts by weight, preferably 1 to 7 parts by weight, per 100 parts by weight of the specific novolak resin. When the amount of the cross-linking agent used is less than 1 part by weight, the curing of the irradiated portions of the composition becomes insufficient to make it difficult to form a resist pattern. When the amount exceeds 10 parts by weight, the strippability of the composition becomes low.

(3) The specific acid-generating agent

The specific acid-generating agent used in this invention is a compound represented by the following formula (I) which generates an acid upon irradiation with a radiation:

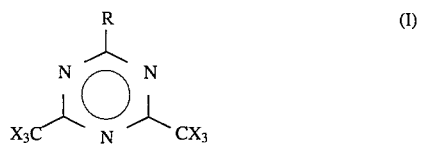

wherein R represents a $CX_3$ group, a substituted or unsubstituted phenyl group, a substituted or unsubstituted naphthyl group, a substituted or unsubstituted styryl group, a substituted or unsubstituted furylethylidene group or a substituted or unsubstituted benzodioxolyl group and X's may be the same as or different from one another and each represents a halogen atom.

Such specific acid-generating agents include, for example, 2-[1-(3,4-benzodioxolyl)]-4,6-bis(trichloromethyl)-1,3,5-triazine, 2-[1-(2,3-benzodioxolyl)]-4,6-bis-(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidene]-4,6-bis(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichlormethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxyfuryl)ethylidene]-4,6-bis(trichloromethyl)-1,3,5-triazine, 2-(2-furylethylidene)-4,6-bis(tribromomethyl)-1,3,5-triazine, 2-[2-(5-methylfuryl)ethylidene]-4,6-bis(tribromomethyl)-1,3,5-triazine, 2-[2-(4-methylfuryl)ethylidene]-4,6-bis(tribromomethyl)-1,3,5-triazine, 2-[2-(3-methylfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2,4,6-tris(trichloromethyl)-1,3,5-triazine, 2,4,6-tris(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(trichloromethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like.

These specific acid-generating agents may be used alone or in admixture of two or more. The amount of the specific acid-generating agent used is 0.01 to 5 parts by weight, preferably 0.1 to 3 parts by weight, per 100 parts by weight of the specific novolak resin. When the amount of the specific acid-generating agent is less than 0.01 part by weight, it is difficult to form a resist pattern when the composition is used as a negative type resist, and when the amount exceeds 5 parts by weight, the shape of the resist pattern becomes inferior and the strippability of the composition is lowered.

In this invention, it is possible to use other compounds generating an acid upon irradiation than the specific acid-generating agent in combination of the specific acid-generating agent. Said other acid-generating agent includes, for example, onium salts, haloalkyl group-containing compounds, quinonediazide compounds, β-ketosulfone compounds, β-sulfonylsulfone compounds, nitrobenzyl sulfonate compounds, dinitrobenzyl sulfonate compounds, sulfonic acid ester compounds and the like.

Additives

The composition of this invention may, if necessary, have added thereto various additives.

Such additives include, for example, surfactants having a function of improving the coatability of the composition, a striation of a resist film and the developability of the irradiated portions after the formation of a resist film.

Said surfactants includes, for example, nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyoxyethylene glycol dilaurate, polyethylene glycol distearate and the like; KP341 (a trade name of Shin-Etsu Chemical Co., Ltd. for organosiloxane polymer); Polyflow No. 75 and No. 95 (trade names of Kyoeisha Yushikagaku Kogyo K. K. for acrylic and methacrylic acid polymers); and fluorine-containing surfactants such as F Top EF301, EF302, EF303 and EF352 (trade names of Shin Akita Kasei K. K.), Megafacs F171, F172 and F173 (trade names of DAINIPPON INK & CHEMICALS, INC.), Fluorad FC430 and FC431 (trade names of Sumitomo 3M Limited), Asahi Guard AG710 and Surflon S-382, SC-101, SC-102, SC-103, SC-104, SC-105 and SC-106 (trade names of Asahi Glass Co., Ltd.); etc.

These surfactants may be used alone or in admixture of two or more. The amount of the surfactant used is preferably 2 parts by weight or less per 100 parts by weight of the specific novolak resin.

As other additives, there are mentioned sensitizers, halation-preventing agents, storage stabilizers, defoaming agents and the like.

Solvents

In the formation of a resist pattern using the composition of this invention, a composition solution is prepared by dissolving the composition together with the optional additives in a solvent so that the solids concentration becomes, for example, 5 to 50% by weight, and then filtering the solution through a filter having a pore diameter of, for example, about 0.2 μm.

The solvent used in the preparation of the composition solution includes, for example, methyl Cellosolve, ethyl Cellosolve, methyl Cellosolve acetate, ethyl Cellosolve acetate, propylene glycol ethyl ether acetate, propylene glycol ethyl ether acetate, propylene glycol propyl ether acetate, toluene, xylene, methyl ethyl ketone, cyclohexanone, methyl 2-hydroxypropionate, ethyl 2-hydroxypropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanate, 3-methyl-3-methoxybutyl acetate, 3-methyl-3-methoxybutyl propionate, 3-methyl-3-methoxybutyl butanate, ethyl acetate, butyl acetate, methyl pyruvate, ethyl pyruvate and the like.

These solvents may be used alone or in admixture of two or more.

These solvents may, if necessary, have added thereto at least one high-boiling solvent such as benzyl ethyl ether, dihexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl Cellosolve acetate and the like.

Application

The thus prepared composition solution is applied to a substrate such as silicon wafer, aluminum-coated wafer or the like by an adequate coating method such as spin coating, flow coating, roll coating or the like and then dried to form a resist film. Subsequently, this resist film is partially irradiated with a radiation through a desired mask pattern (this irradiation is referred to hereinafter as the exposure) to form a fine resist pattern. In this case, the radiation used is not critical, and various radiations, for example, ultraviolet rays such as g rays, i rays or the like; deep ultraviolet rays such as excimer laser or the like; X rays such as synchrotron radiation or the like; and charged particle beams such as electron beam or the like may be adequately selected depending upon the kind of the specific acid-generating agent used. Also, exposure conditions such as amount of radiation and the like may be appropriately varied depending upon the proportions of the components in the composition, the kind of the additives and the like.

The composition of this invention can be heat-treated to enhance its sensitivity and the like. The heat-treatment conditions may be varied depending upon the proportions of the components in the composition, the kind of the additives and the like; however, it is preferably 30° to 200° C., more preferably 50° to 150° C.

Subsequently, the resist film is developed with a developer to form a resist pattern. As the developer for this purpose, there is used an aqueous alkaline solution prepared by dissolving in water an alkali compound, for example, sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicylo-[5,4,0]-7-undecene, 1,5-diazabicyclo-[4,3,0]-5-nonene or the like so that the concentration becomes, for example, 1 to 10% by weight.

The above developer may have added thereto an appropriate amount of a water-soluble organic solvent, for example, an alcohol such as methanol, ethanol or the like and a surfactant.

Incidentally, when a developer consisting of such an aqueous alkaline solution is used, the resist film is washed with water after the development and then dried.

In this invention, as the developer, it is also possible to use those solvents which are used in the preparation of the above composition solution; ketones such as acetone, methyl ethyl ketone, methyl isobutyl ketone and the like; and alcohols such as methanol, ethanol, isopropanol and the like; however, the above-mentioned aqueous alkaline solution is more preferable in view of the problem of working environment and even in respect of developability.

DESCRIPTION OF THE PREFERRED EMBODIMENTS

This invention is explained in more detail below referring to Examples and Comparative Examples; however, this invention is not limited thereto.

In the Examples and Comparative Examples, the measurement of Mw and the evaluation of the performance of resist were conducted by the following methods: Mw: Measured by a gel permeation chromatography method in which a monodisperse polystyrene was used as a standard using GPC columns manufactured by TOSOH CORP. (two $G2000H_{XL}$ columns, one $G3000H_{XL}$ column and one $G4000H_{XL}$ column), under such analysis conditions that the flow rate was 1.0 milliliter/min, the eluent was tetrahydrofuran and the column temperature was 40° C.

Shape of resist pattern: Using a NSR-1505i6A stepper manufactured by NIKON CORP. (lens numerical aperture= 0.45), a resist film formed on a silicon wafer was exposed to i rays having a wavelength of 365 nm at a varying exposure time depending upon the place irradiated and then developed with a 2.38% by weight aqueous tetramethylammonium hydroxide solution at 23° C. for 60 seconds, washed with water and then dried to form a resist pattern. The resist pattern at an exposure time at which a line-and-space pattern of 2.0 μm was formed in a 1:1 line width was observed through a scanning type electron microscope. In the case where a clear rectangle was observed the pattern shape was decided as "good", and in the cases where the film thickness of the pattern portion was 70% of the initial thickness of the resist film, where the pattern film surface was roughened with the developer and wherein undeveloped portion was observed, the pattern shape was decided as "bad".

Adhesion: Using an ultraviolet rays exposure apparatus manufactured by CANON INC. (PLA501F), the resist film was exposed at an exposure time at which a line-and-space pattern of 10 μm was formed in a 1:1 line width, and then developed with a 2.38% by weight aqueous tetramethylammonium hydroxide solution at 25° C. for 60 seconds, washed with water and then dried to form a resist pattern on an amorphous Si substrate. Subsequently, the resist pattern was calcined on a hot plate at 140° C. for 120 seconds, and thereafter, etched with an aqueous solution containing nitric acid (65% by weight) and hydrofluoric acid (10% by weight) at 25° C. for three minutes. The adhesion was evaluated based on the remaining resist pattern having a minimum dimension after the etching.

Acid resistance: Etching was effected in the same manner as in the evaluation of adhesion, and the acid resistance was evaluated based on whether the resist pattern film surface was roughened or not.

Strippability: The substrate which had been subjected to etching in the same manner as in the evaluation of the adhesion was immersed in a mixed solution of dimethyl sulfoxide and pyrrolidine (6/4 by weight) at 80° C. to strip the resist pattern, and the strippability was evaluated based on the time required until the pattern portion was completely dissolved in the mixed solution.

EXAMPLE 1

In 360 g of methyl 3-methoxypropionate were dissolved 100 g of a novolak resin prepared by polycondensation of m-cresol and p-cresol with formaldehyde (the mole ratio of m-cresol/p-cresol charged=6/4 and Mw =5,000) [referred to hereinafter as the novolak resin (1)], 6 g of an oligomer in which hexamethoxymethylolmelamine was the monomeric component, the content of the monomeric component was about 70% by weight, and Mw was 520 [referred to hereinafter as the melamine-formaldehyde resin (A)] and 2 g of 2-[1-(3,4-benzodioxolyl)-4,6-bis(trichloromethyl)-1,3,5-triazine, and the resulting solution was filtered through a membrane filter having a pore diameter of 0.2 μm to prepare a composition solution.

This composition solution was spin-coated on a substrate by a spinner so that the dry film thickness became 1.2 μm, and prebaked on a hot plate at 100° C. for 120 seconds to form a resist film. This resist film was subjected to evaluation of performance.

The evaluation results are shown in Table 1.

EXAMPLE 2

In 400 g of ethyl 2-hydroxypropionate were dissolved a mixture (Mw =6,000) of 60 g of a novolak resin prepared by polycondensation of m-cresol and p-cresol with formaldehyde (the mole ratio of m-cresol/p-cresol charged =9/1 and Mw =2,500) [referred to hereinafter as the novolak resin (2)] and 40 g of another novolak resin prepared by polycondensation of m-cresol, p-cresol and 3,5-xylenol with formaldehyde (the mole ratio of m-cresol/p-cresol/3,5-xylenol charged=5/4/1 and Mw =11,000) [referred to hereinafter as the novolak resin (3)], 5 g of the melamine-formaldehyde resin (A) and 0.5 g of 2-(4-methoxystyryl)-4,6-bis(trichloromethyl)-1,3,5-triazine, and the resulting solution was filtered through a membrane filter having a pore diameter of 0.2 μm to prepare a composition solution.

This composition solution was spin-coated on a substrate by a spinner so that the dry film thickness became 1.5 μm, and prebaked on a hot plate at 100° C. for 120 seconds to form a resist film. This resist film was subjected to evaluation of performance.

The evaluation results are shown in Table 1.

Example 3

In 400 g of ethyl 2-hydroxypropionate were dissolved 75 g of the novolak resin (1), 25 g of poly(p-hydroxystyrene) (Mw=3,000), 3 g of the melamine-formaldehyde resin (A) and 1.5 g of 2-[2-(5-methoxyfuryl)ethylidene]-4,6-bis-(trichloromethyl)-1,3,5-triazine, and the resulting solution was filtered through a membrane filter having a pore diameter of 0.2 μm to prepare a composition solution.

This composition solution was spin-coated on a substrate by a spinner so that the dry film thickness became 1.2 μm, and prebaked on a hot plate at 100° C. for 120 seconds to prepare a resist film. This resist film was subjected to evaluation of performance.

The evaluation results are shown in Table 1.

Example 4

In 300 g of ethyl 3-ethoxypropionate were dissolved a mixture (Mw =6,000) of 48 g of the novolak resin (2) and 32 g of the novolak resin (3), 20 g of 1,1-bis(4-hydroxyphenyl)-1-[4-{1-(4-hydroxyphenyl)-1-methylethyl}phenyl]ethane, 3 g of the melamine-formaldehyde resin (A) and 2 g of 2-(4-methoxynaphthyl)-4,6-bis(trichloromethyl)-1,3,5-triazine, and the resulting solution was filtered through a membrane filter having a pore diameter of 0.2 μm to prepare a composition solution.

This composition solution was spin-coated on a substrate by a spinner so that the dry film thickness became of 1.0 μm, and prebaked on a hot plate at 90° C. for 120 seconds to form a resist film. This resist film was subjected to evaluation of performance.

The evaluation results are shown in Table 1.

Comparative Example 1

The same procedure as in Example 1 was repeated, except that the amount of the melamine-formaldehyde resin (A) was changed to 15 g to form a resist film and this resist film was subjected to the same evaluation of performance as in Example 1.

The evaluation results are shown in Table 2.

Comparative Example 2

The same procedure as in Example 2 was repeated, except that 100 g of the novolak resin (3) was substituted for the mixture of 60 g of the novolak resin (2) and 40 g of the novolak resin (3) to form a resist pattern and this resist film was subjected to the same evaluation of performance as in Example 2.

The evaluation results are shown in Table 2.

TABLE 1

| | Components | | Example 1 | Example 2 | Example 3 | Example 4 |
|---|---|---|---|---|---|---|
| (1) | Novolak resin (1) | (g) | 100 | — | 75 | — |
| | Novolak resin (2) | (g) | — | 60 | — | 48 |
| | Novolak resin (3) | (g) | — | 40 | — | 32 |
| *1 | Poly(p-hydroxystyrene) (Mw = 3,000) | (g) | — | — | 25 | — |
| | 1,1-Bis(4-hydroxyphenyl)-1-[4-{1-(4-hydroxyphenyl)-1-methylethyl}phenyl]ethane | (g) | — | — | — | 20 |
| (2) | Melamine-formaldehyde resin (A) | (g) | 6 | 5 | 3 | 3 |
| (3) | 2-[1-(3,4-Benzodioxoyl]-4,6-bis(trichloromethyl)-1,3,5-triazine | (g) | 2 | — | — | — |
| | 2-(4-methoxystyryl)-4,6-bis(trichloromethyl)-1,3,5-triazine | (g) | — | 0.5 | — | — |
| | 2-[2-(5-methoxyfuryl)-ethylidene]-4,6-bis(trichloromethyl)-1,3,5-triazine | (g) | — | — | 1.5 | — |
| | 2-(4-methoxynaphthyl)-4,6-bis(trichloromethyl)-1,3,5-triazine | (g) | — | — | — | 1 |
| Evaluation | Shape of resist pattern | | Good | Good | Good | Good |
| | Adhesion | (μm) | 4 | 3 | 4 | 3 |
| | Acid resistance | | Good | Good | Good | Good |
| | Strippability | (sec) | 5 | 8 | 3 | 5 |

Note:
*1; Other novolak resins and phenolic compounds than the novolak resins.

TABLE 2

| Components | | | Comp. Ex. 1 | Comp. Ex. 2 |
|---|---|---|---|---|
| (1) | Novolak resin (1) | (g) | 100 | — |
| | Novolak resin (2) | (g) | — | — |
| | Novolak resin (3) | (g) | — | 100 |
| *1 | Poly(p-hydroxystyrene) (Mw = 3,000) | (g) | — | — |
| | 1,1-Bis(4-hydroxyphenyl)-1-[4-{1-(4-hydroxyphenyl)-1-methyl-ethyl}phenyl]ethane | (g) | — | — |
| (2) | Melamine-formaldehyde resin (A) | (g) | 15 | 5 |
| (3) | 2-[1-(3,4-Benzodioxolyl]-4,6-bis-(trichloromethyl)-1,3,5-triazine | (g) | 2 | — |
| | 2-(4-methoxystyryl)-4,6-bis(tri-chloromethyl)-1,3,5-triazine | (g) | — | 0.5 |
| | 2-[2-(5-methoxyfuryl)ethylidene]-4,6-bis(trichloromethyl)-1,3,5-triazine | (g) | — | — |
| | 2-(4-methoxynaphthyl)-4,6-bis-(trichloromethyl)-1,3,5-triazine | (g) | — | — |
| Eval-uation | Shape of resist pattern | | Good | Good |
| | Adhesion | (μm) | 6 | 10 |
| | Acid resistance | | Good | Good |
| | Strippability | (sec) | *2 | *2 |

Note:
*1; Other novolak resins and phenolic compounds than the novolak resins
*2; Not completely dissolved even after 10 min.

What is claimed is:

1. A radiation sensitive resin composition, comprising:

(1) 100 parts by weight of an alkali-soluble novolak resin having a polystyrene reduced weight average molecular weight of 1,000 to 10,000, (2) 1 to 10 parts by weight of a compound having at least one group selected from the group consisting of a methylol group and an alkoxymethyl group and capable of cross-linking the alkali-soluble novolak resin (1) in the presence of an acid, and (3) 0.01 to 5 parts by weight of a radiation sensitive acid-generating agent, wherein said radiation sensitive acid-generating agent is 2-(1-(3,4-benzodioxolyl))-4,6-bis(trichloromethyl)-1,3,5-triazine.

2. The radiation sensitive resin composition of claim 1, further comprising (4) 70 parts by weight or less of at least one phenolic compound selected from the group consisting of hydroxystyrene polymers and phenols having 2 to 6 benzene rings.

3. The radiation sensitive resin composition of claim 2, wherein said phenolic compound is polyhydroxystyrene.

4. The radiation sensitive resin composition of claim 2, wherein said phenolic compound is a phenol having 2 to 6 benzene rings.

* * * * *